(12) United States Patent
Yoon et al.

(10) Patent No.: US 12,078,875 B2
(45) Date of Patent: Sep. 3, 2024

(54) DISPLAY DEVICE AND METHOD OF MANUFACTURING THE SAME

(71) Applicant: Samsung Display Co., Ltd., Yongin-Si (KR)

(72) Inventors: Seon-Tae Yoon, Hwaseong-si (KR); Junghyun Kwon, Yongin-si (KR); Hyojoon Kim, Suwon-si (KR); Yunha Ryu, Hwaseong-si (KR); Kisoo Park, Hwaseong-si (KR); Hyeseung Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 388 days.

(21) Appl. No.: 17/397,102

(22) Filed: Aug. 9, 2021

(65) Prior Publication Data
US 2022/0091445 A1    Mar. 24, 2022

(30) Foreign Application Priority Data
Sep. 22, 2020 (KR) .......................... 10-2020-0122306

(51) Int. Cl.
*G02F 1/1339* (2006.01)
*G02F 1/01* (2006.01)
(Continued)

(52) U.S. Cl.
CPC ........ *G02F 1/0105* (2013.01); *G02F 1/01791* (2021.01); *G02F 1/13394* (2013.01);
(Continued)

(58) Field of Classification Search
CPC ......... G02F 1/133512; G02F 1/133514; G02F 1/13394; G02F 1/13398; G02F 1/133614; H01L 33/50; H01L 33/507; H10K 59/38
See application file for complete search history.

(56) References Cited

U.S. PATENT DOCUMENTS

2005/0179853 A1* 8/2005 Chen .................. G02F 1/13394
349/155
2016/0372528 A1* 12/2016 Kamura ............... H01L 31/055
(Continued)

FOREIGN PATENT DOCUMENTS

JP        2015220215 A    12/2015
KR        100493866 B1    6/2005
(Continued)

OTHER PUBLICATIONS

Extended European Search Report for Application No. 21197901.8-1212 dated Feb. 8, 2022.

*Primary Examiner* — Angela K Davison
(74) *Attorney, Agent, or Firm* — CANTOR COLBURN LLP

(57) ABSTRACT

A display device includes a lower substrate including first and second pixel areas and a light shielding area surrounding the first and second pixel areas, a light emitting structure disposed on the lower substrate, an upper substrate disposed on the light emitting structure, a first color conversion layer disposed in the first pixel area on a bottom surface of the upper substrate, a second color conversion layer disposed in the second pixel area on the bottom surface of the upper substrate, first to third light shielding patterns disposed in the light shielding area on the bottom surface of the upper substrate, a groove defined on a bottom surface of at least one selected from the first to third light shielding patterns, and a spacer disposed in the groove.

20 Claims, 10 Drawing Sheets

(51) Int. Cl.
    *G02F 1/017*         (2006.01)
    *G02F 1/1335*       (2006.01)
    *H10K 59/38*        (2023.01)
    *H10K 59/35*        (2023.01)

(52) U.S. Cl.
    CPC .. *G02F 1/133512* (2013.01); *G02F 1/133614* (2021.01); *G02F 2201/50* (2013.01); *H10K 59/35* (2023.02); *H10K 59/38* (2023.02)

(56) References Cited

U.S. PATENT DOCUMENTS

| | | | |
|---|---|---|---|
| 2019/0025634 A1* | 1/2019 | Park | G02F 1/133516 |
| 2020/0194503 A1 | 6/2020 | Jo et al. | |
| 2020/0303676 A1* | 9/2020 | Lin | H10K 50/852 |

FOREIGN PATENT DOCUMENTS

| | | |
|---|---|---|
| KR | 1020060120886 A | 11/2006 |
| KR | 101110071 B1 | 2/2012 |
| KR | 1020200001649 A | 1/2020 |
| KR | 1020200072650 A | 6/2020 |

\* cited by examiner

DISPLAY DEVICE AND METHOD OF MANUFACTURING THE SAME

This application claims priority to Korean Patent Application No. 10-2020-0122306, filed on Sep. 22, 2020, and all the benefits accruing therefrom under 35 U.S.C. § 119, the content of which in its entirety is herein incorporated by reference.

BACKGROUND

1. Field

Embodiments relate to a display device and a method of manufacturing the display device.

2. Description of the Related Art

A display device is a device that displays an image for providing visual information to a user. The display device may include a light emitting structure that generates light for displaying an image and a color conversion layer that converts the light generated from the light emitting structure. In such a display device, the light emitting structure may be formed on a lower substrate included in the display device by performing a patterning process using a mask, and the color conversion layer may be formed on a bottom surface of an upper substrate included in the display device by using an inkjet method. In a method of manufacturing the display device, a process for combining the lower substrate and the upper substrate may be performed after each of the lower substrate on which the light emitting structure is disposed and the upper substrate under which the color conversion layer is disposed are manufactured. The display device may further include a spacer to maintain a gap between the light emitting structure and the color conversion layer.

SUMMARY

Embodiments provide a display device.

Embodiments provide a method of manufacturing the display device.

According to an embodiment of the invention, a display device includes a lower substrate including first and second pixel areas and a light shielding area surrounding the first and second pixel areas, a light emitting structure disposed on the lower substrate, an upper substrate disposed on the light emitting structure, a first color conversion layer disposed in the first pixel area on a bottom surface of the upper substrate, a second color conversion layer disposed in the second pixel area on the bottom surface of the upper substrate, first to third light shielding patterns disposed in the light shielding area on the bottom surface of the upper substrate, a groove defined on a bottom surface of at least one selected from the first to third light shielding patterns and a spacer disposed in the groove.

In an embodiment, a material of the spacer may be the same as one selected from a material of the first color conversion layer and a material of the second color conversion layer.

In an embodiment, the spacer may protrude from the bottom surface of the light shielding pattern in a direction from the upper substrate to the lower substrate.

In an embodiment, the display device may further include a filling layer disposed between the light emitting structure and the first and second color conversion layers.

In an embodiment, a part of the spacer may be disposed through the filling layer and contacts the light emitting structure.

In an embodiment, the spacer may separate a bottom surface of each of the first to third light shielding patterns from an upper surface of the light emitting structure.

In an embodiment, the lower substrate may further include a third pixel area spaced apart from the first and second pixel areas, and the display device may further include a transmissive layer disposed in the third pixel area on a bottom surface of the upper substrate.

In an embodiment, the spacer may include a same material as one selected form a material of the first color conversion layer, a material of the second color conversion layer, and a material of the transmissive layer.

In an embodiment, the first light shielding pattern may be disposed on a first side surface of the first color conversion layer, the second light shielding pattern may be disposed between a second side surface of the first color conversion layer and a first side surface of the second color conversion layer, and the third light shielding pattern may be disposed between a second side surface of the second color conversion layer and a first side surface of the transmissive layer.

In an embodiment, the first color conversion layer may include first quantum dots which are excited by a light generated from the light emitting structure to emit a first color light, the second color conversion layer includes second quantum dots which are excited by the light to emit a second color light, and the transmissive layer may transmit the light to emit a third color light.

In an embodiment, the third color light may have a wavelength shorter than each of the first color light and the second color light.

In an embodiment, the third color light may be blue light, the first color light may be red light, and the second color light may be green light.

In an embodiment, the display device may further include a first color filter layer disposed between the upper substrate and the first color conversion layer, wherein the first color filter layer may selectively transmit a first color light emitted from the first color conversion layer, a second color filter layer disposed between the upper substrate and the second color conversion layer, wherein the second color filter layer may selectively transmit a second color light emitted from the second color conversion layer; and a third color filter layer disposed between the upper substrate and the transmissive layer, wherein the third color filter layer may selectively transmit a third color light transmitted from the transmissive layer.

In an embodiment, the groove may extend in a direction from the lower substrate to the upper substrate such that the groove may define a through opening, and the spacer may be disposed in the through opening.

In an embodiment, the display device may further include an inorganic protective layer disposed between the upper substrate and the first and second color conversion layers.

In an embodiment, the spacer may contact the inorganic protective layer.

According to an embodiment of the invention, a method of manufacturing a display device includes preparing an upper substrate, providing a preliminary light shielding pattern on a first surface of the upper substrate, forming first to third openings and a groove in the preliminary light shielding pattern, providing a first color conversion layer, a second color conversion layer, and a transmissive layer in the first to third openings, respectively and providing a spacer in the groove.

In an embodiment, first to third light shielding patterns may be defined by the first to third openings of the preliminary light shielding pattern, and the groove may be formed in a surface of at least one selected from the first to third light shielding patterns.

In an embodiment, the spacer may include a same material as one selected from a material of the first color conversion layer, a material of the second color conversion layer and a material of the transmissive layer.

In an embodiment, the first to third openings and the groove may be simultaneously formed using a halftone mask.

Embodiments of the display device according the invention includes a groove defined on a bottom surface of the light shielding pattern, so that the spacer may be disposed in the groove. In such embodiments, the first color conversion layer, the second color conversion layer, the transmissive layer, and the spacer may be simultaneously formed, and the spacer may include a same material as one selected from the first color conversion layer, the second color conversion layer, and the transmissive layer. Accordingly, a separate process for manufacturing the spacer may not be added, and a manufacturing cost of the display device may be relatively reduced.

In embodiments of a method of manufacturing a display device according to f the invention, the spacer may be simultaneously formed with the first color conversion layer, the second color conversion layer, and the transmissive layer in an inkjet method. In such embodiments, an additional patterning process using a mask may not be used to manufacture the spacer. Accordingly, a manufacturing process may be simplified, and a manufacturing cost and a manufacturing time may be relatively reduced.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
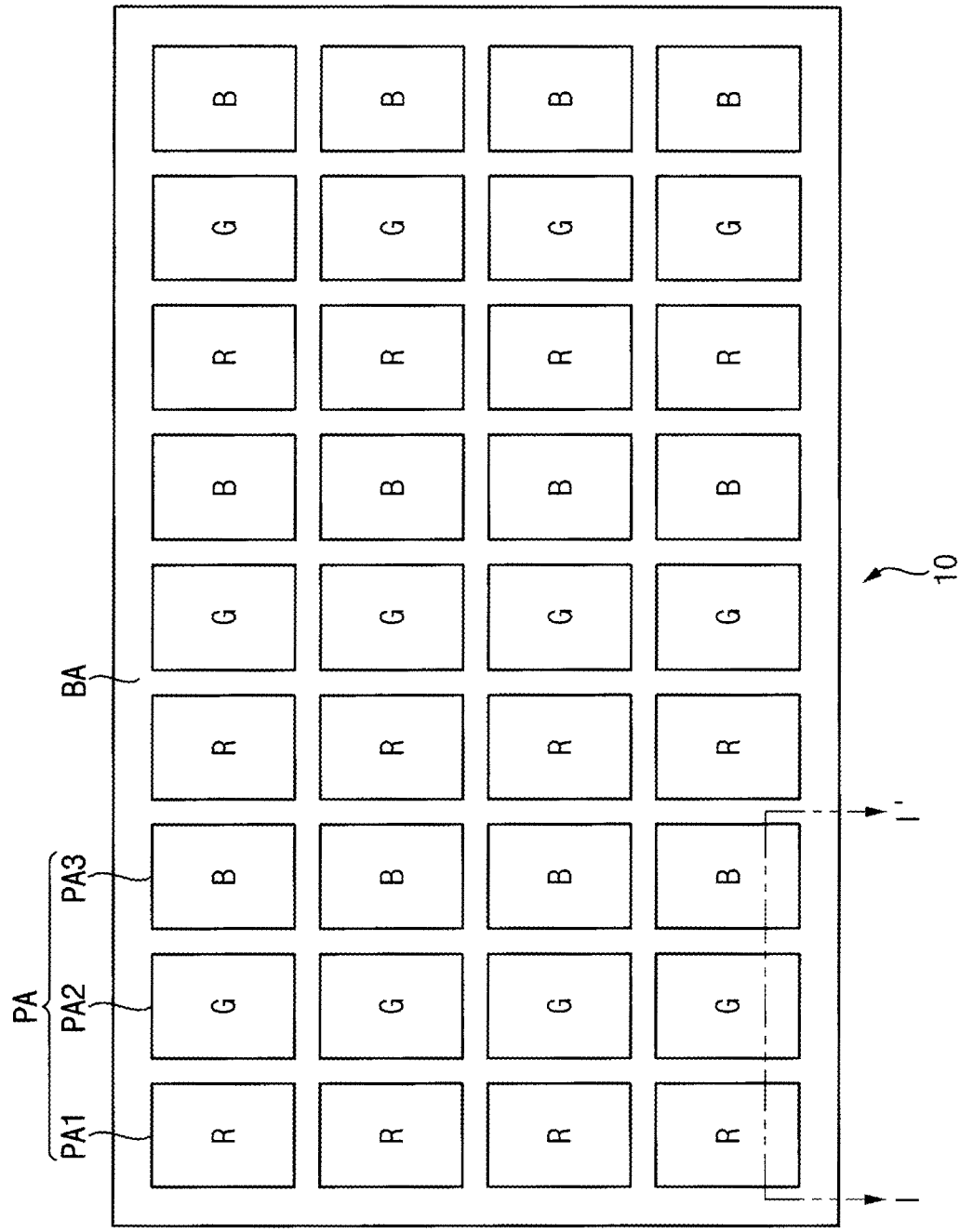
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of a display device and a method of manufacturing the display device according to the invention will be described in detail with reference to the accompanying drawings. Like reference numerals refer to like elements throughout, and any repetitive detailed descriptions thereof may be omitted or simplified.

Figure 2:
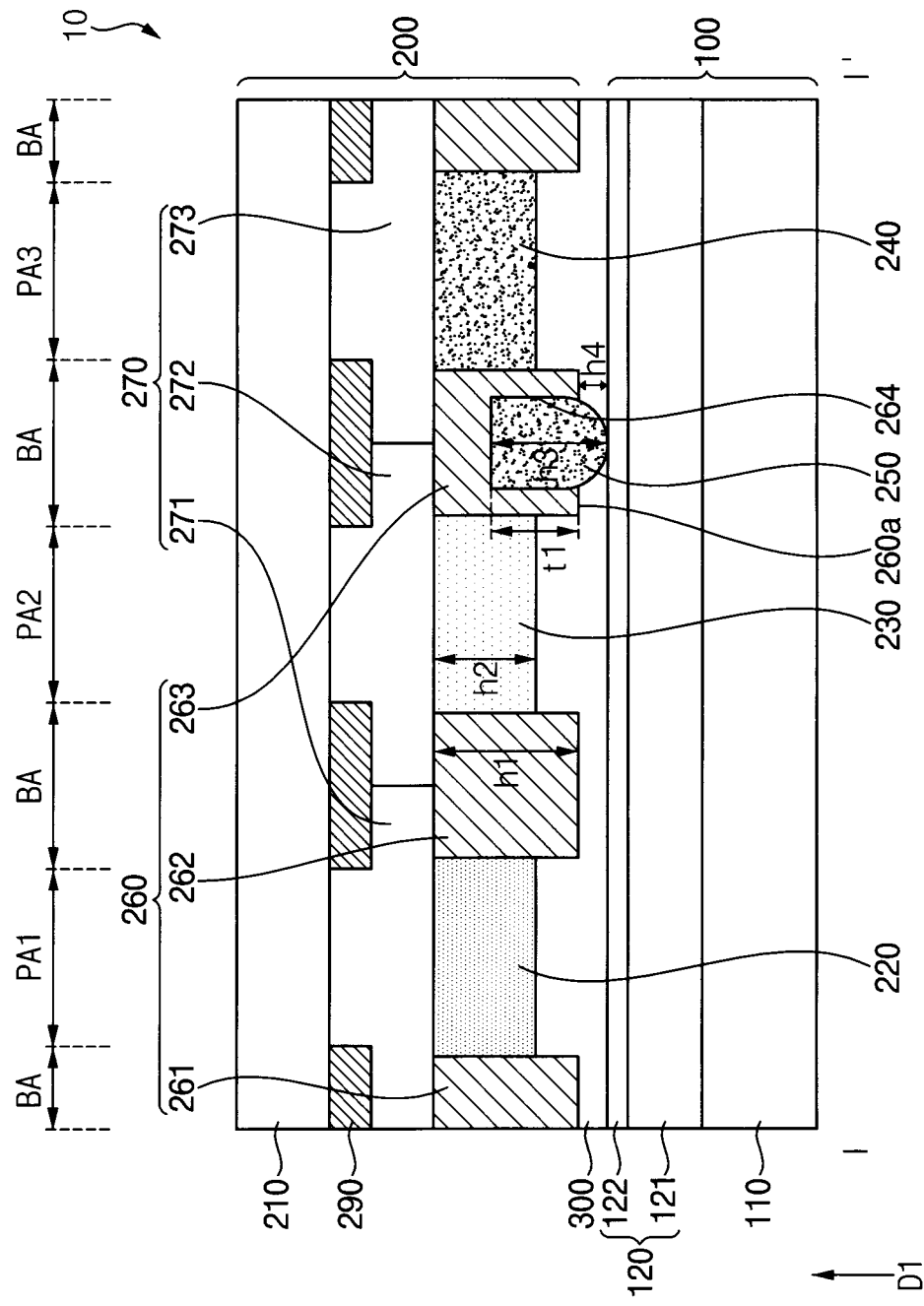
FIG. 2 is a cross-sectional view taken along line I-I' of FIG. 1.

FIG. 1 is a plan view illustrating a display device according to an embodiment. FIG. 2 is a cross-sectional view taken along line I-I' of FIG. 1, and FIG. 3 is a cross-sectional view illustrating first and second color conversion layers and a transmissive layer included in the display device of FIG. 2.

Figure 3:
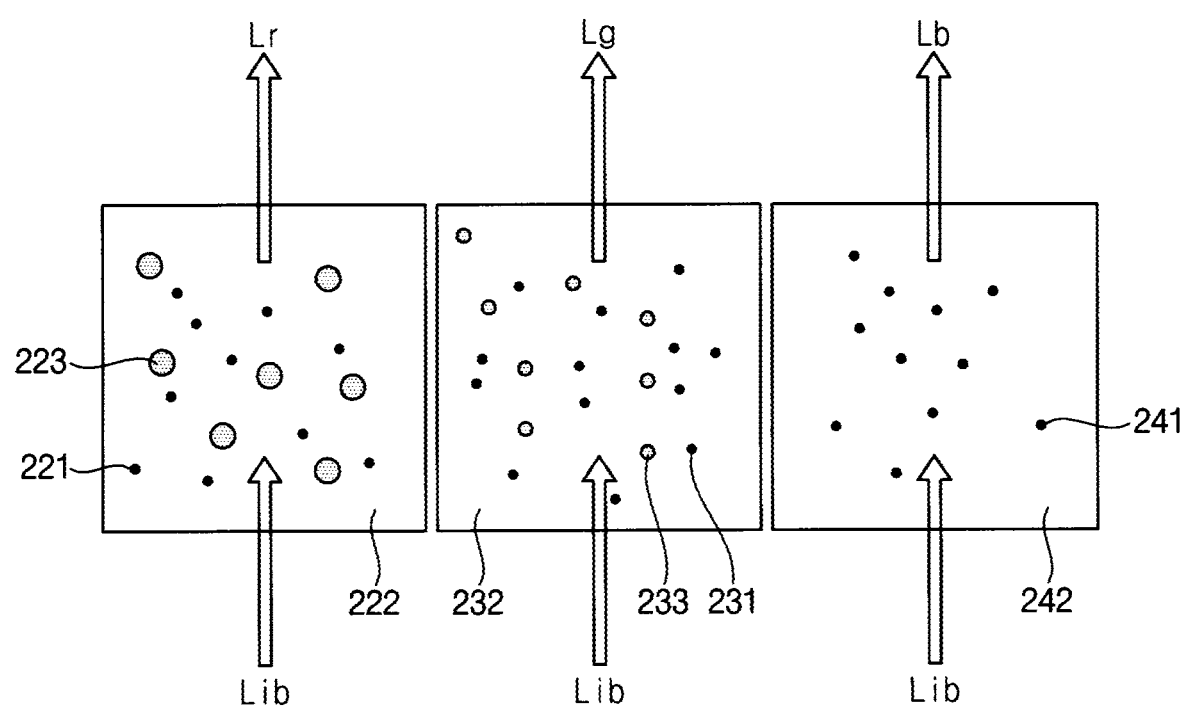
FIG. 3 is a cross-sectional view illustrating first and second color conversion layers and a transmissive layer included in the display device of FIG. 2.

Referring to FIG. 1 to FIG. 3, an embodiment of the display device 10 may include a lower substrate structure 100 and an upper substrate structure 200. In such an embodiment, the lower substrate structure 100 may include a lower substrate 110 and a light emitting structure 120, and the upper substrate structure 200 may include an upper substrate 210, a first color conversion layer 220 and a second color conversion layer 230, a transmissive layer 240, a light shielding pattern 260, a groove 264, a spacer 250, a color filter layer 270 and a filling layer 300. In such an embodiment, the light shielding pattern 260 may include a first light shielding pattern 261, a second light shielding pattern 262 and a third light shielding pattern 263, and the color filter layer 270 may include a first color filter layer 271, a second color filter layer 272 and a third color filter layer 273. In such an embodiment, the first light shielding pattern 261, the second light shielding pattern 262 and the third light shielding pattern 263 may be defined by portions of the light shielding pattern 260 between the first color conversion layer 220, the second color conversion layer 230 and the transmissive layer 240. In such an embodiment, the light emitting structure 120 may include a light emitting layer 121 and a thin film encapsulation layer 122.

The lower substrate 110 may include first to third pixel areas PA1, PA2, and PA3, and a light shielding area BA surrounding the first to third pixel areas PA1, PA2, and PA3. In such an embodiment, the first to third pixel areas PA1, PA2, and PA3, and the light shielding area BA surrounding the first to third pixel areas PA1, PA2, and PA3 may be defined on the lower substrate 110. The lower substrate 110 may include or be formed of a material such as glass, metal, or organic material. In such an embodiment, the light emitting structure 120 may be disposed on the lower substrate 110.

The light emitting layer 121 may include a light emitting device, and light may be generated from the light emitting device. The light emitting device may include an organic light emitting device ("OLED"), a micro light emitting device, a nano light emitting device, etc. However, the light emitting device is not limited thereto and may be a device including a material that emits light.

The thin film encapsulation layer 122 may be disposed on the light emitting layer 121. The thin film encapsulation layer 122 may be disposed on the entire surface of the lower substrate 110. The thin film encapsulation layer 122 may include an inorganic encapsulation layer including an inorganic material and an organic encapsulation layer including an organic material.

The upper substrate 210 may be disposed on the light emitting structure 120 and may face the lower substrate 110. In an embodiment where the lower substrate 110 includes the first pixel area PA1, the second pixel area PA2, the third pixel area PA3, and the light shielding area BA, the upper substrate may also be divided into the first to third pixel areas PA1, PA2, PA3 and the light shielding area BA.

The first color conversion layer 220 may be disposed in the first pixel area PA1 on a bottom surface (or an inner surface) of the upper substrate 210, and the second color conversion layer 230 may be disposed in the second pixel area PA2 on the bottom surface of the upper substrate 210, and the transmissive layer 240 may be disposed in the third pixel area PA3 on the bottom surface of the upper substrate 210. The first color conversion layer 220 may convert light Lib generated from the light emitting structure 120 into a first color light Lr. The second color conversion layer 230 may convert light Lib into a second color light Lg. The transmissive layer 240 may transmit the light Lib without any conversion.

In an embodiment, as shown in FIG. 1, the pixel area PA may be an area from which light Lib is emitted, and may be surrounded by the light shielding area BA. The pixel area PA may be divided into the first pixel area PA1, the second pixel area PA2, and the third pixel area PA3 according to the color of the emitted light therefrom. In one embodiment, for example, the first pixel area PA1 may be an area from which the first color light Lr is emitted, the second pixel area PA2 may be an area from which the second color light Lg is emitted, and the third pixel area PA3 may be an area in which the third color of light Lb is emitted. However, FIG. 1 shows the arrangement of the pixel areas PA1, PA2, and PA3 in one embodiment, and the invention is not limited thereto. The first to third pixel areas PA1, PA2, and PA3 may be arranged in various shapes corresponding to the arrangement of the light emitting devices of the display device 10.

The light shielding area BA may be an area from which light Lib is not emitted, and may be located between the first to third pixel areas PA1, PA2, and PA3, and may have a mesh-like shape. The light shielding layer 290 may be disposed to overlap the light shielding area BA. The light shielding layer 290 may be formed as or in a form of a thin film in the light shielding area BA. When the light is emitted through the light shielding area BA, light leakage may occur in the display device. In such an embodiment, the light shielding layer 290 may prevent light leakage due to light being emitted to the outside through the light shielding area BA.

The upper substrate 210 may be a transparent substrate. In an embodiment, the first and second color lights Lr and Lg emitted from the first color conversion layer 220 and the second color conversion layer 230 may be emitted through the first and second pixel areas PA1 and PA2 of the upper substrate 210. In such an embodiment, light Lb of a third color may be emitted through the third pixel area PA3 of the upper substrate 210.

Material of the upper substrate 210 may not be particularly limited as long as it is commonly used. In an embodiment, the upper substrate 210 may include or be formed of an insulating material such as glass, plastic, or crystal. In one embodiment, for example, the upper substrate 210 may include or be formed of an organic polymer material such as polycarbonate ("PC"), polyethylene terephthalate ("PET"), polyethylene ("PE"), and polypropylene ("PP").

In an embodiment, the light shielding pattern 260 may be disposed in the light shielding area BA on the bottom surface of the upper substrate 210. In such an embodiment, the first light shielding pattern 261 may be disposed in the light shielding area BA on the bottom surface of the upper substrate 210, and may be disposed on a first side surface of the first color conversion layer 220. The first side surface of the first color conversion layer 220 may be a left side surface. The second light shielding pattern 262 may be disposed in the light shielding area BA on the bottom surface of the upper substrate 210, and may be disposed between a second side surface of the first color conversion layer 220 and a first side surface the second color conversion layer 230. The second side surface may be a right side surface of the first color conversion layer 220. The third light shielding pattern 263 may be disposed in the light shielding area BA on the bottom surface of the upper substrate 210, and may be disposed between a second side surface of the second color conversion layer 230 and the transmissive layer 240. The light shielding pattern 260 may contact opposing side surfaces of two adjacent layers among the first color conversion layer 220, the second color conversion layer 230, and the transmissive layer 240. The light shielding pattern 260 may absorb light penetrating into interfaces where the first color conversion layer 220, the second color conversion layer 230, and the transmissive layer 240 contact each other. The light shielding pattern 260 may be repeatedly provided or formed as shown in FIG. 1. The light shielding pattern disposed on the right side surface of the transmissive layer 240 illustrated in FIG. 2 may correspond to the first light shielding pattern 261.

The light shielding pattern 260 may block the first color light Lr emitted from the first color conversion layer 220 from being radiated to the second color conversion layer 230 or the transmissive layer 240, or the second color light Lg emitted from the second color conversion layer 230 from being radiated to the first color conversion layer 220 or the transmissive layer 240, or the third color light Lb emitted from the transmissive layer 240 from being radiated to the first color conversion layer 220 or the second conversion layer 230.

In an embodiment, the height h1 of the light shielding pattern 260 may be designed or determined so that the first color conversion layer 220, the second color conversion layer 230 and the transmissive layer 240 do not overflow into adjacent pixel area when the first color conversion layer 220, the second color conversion layer 230, and the transmissive layer 240 are formed. Herein, height of an element may means a length thereof in a first direction D1, where the first direction D1 may be a direction from the lower substrate 110 to the upper substrate 210 or a thickness direction of the lower substrate 110 or the upper substrate 210. In such an embodiment, a height h2 of each of the first color conversion layer 220, the second color conversion layer 230, and the transmissive layer 240 may be substantially the same as each other, and is less than the height h1 of the light shielding pattern 260. In one embodiment, for example, the height h2 of each of the first color conversion layer 220, the second color conversion layer 230, and the transmissive layer 240 may be about 10 micrometers, and the height h1 of the light shielding pattern 260 may be about 11.5 micrometers. Each of the first color conversion layer 220, the second color conversion layer 230, and the transmissive layer 240 may be provided or formed in an opening defined or formed in the light shielding pattern 260 by an inkjet method.

Referring to FIG. 3, the first color conversion layer 220 may include first quantum dots 223 that are excited by light Lib generated from the light emitting structure 120 and emit the first color light Lr. The first color conversion layer 220 may further include a first photosensitive polymer 222 in which the first scattering particles 221 are dispersed.

The second color conversion layer 230 may include second quantum dots 233 that are excited by light Lib generated from the light emitting structure 120 and emit the second color light Lg. The second color conversion layer 230 may further include a second photosensitive polymer 232 in which the second scattering particles 231 are dispersed.

The transmissive layer 240 may transmit light Lib generated from the light emitting structure 120 and emit the third color light Lb. The third color light Lb may be emitted toward the upper substrate 210. The transmissive layer 240 may include a third photosensitive polymer 242 in which the third scattering particles 241 are dispersed.

Each of the first to third photosensitive polymers 222, 232, and 242 may be an organic material having light transmittance, such as a silicone resin or an epoxy resin. In an embodiment, the first to third photosensitive polymers 222, 232, and 242 may be formed using a same material as each other. In an embodiment, the first to third scattering particles 221, 231, and 241 may scatter the light Lib generated from the light emitting structure 120, and may be formed using a same material as each other.

Referring to FIG. 2, the groove 264 may be defined or formed in a bottom surface 260a of at least one selected from the first to third light shielding patterns 261 to 263. In such an embodiment, the groove 264 may mean that the bottom surface 260a of at least one selected from the first to third light shielding patterns 261 to 263 is formed to be concave or recessed. In an embodiment, as shown in FIG. 2, the groove 264 may be defined or formed on the bottom surface of the third light shielding pattern 263, but not being limited thereto. In an alternative embodiment, the groove 264 may be defined or formed on the bottom surface of any of the light shielding patterns 260. In one embodiment, for example, the groove 264 may be formed on all of the first to third light shielding patterns 261 to 263 or may be defined or formed on only one selected from the first to third light shielding patterns 261 to 263. In an embodiment, where the groove 264 is defined or formed on only one selected from the first to third light shielding patterns 261 to 263, manufacturing cost thereof may be reduced.

In an embodiment, the groove 264 may be formed simultaneously when the light shielding pattern 260 is formed. In such an embodiment, the groove 264 and the light shielding pattern 260 may be formed by a patterning process. In one embodiment, for example, by applying the preliminary light shielding pattern 266 (shown in FIG. 9) on the upper substrate 210, and partially patterning the preliminary light shielding pattern 266, the openings and the grooves 264 may be formed in the preliminary light shielding pattern 266. The first to third light shielding patterns 261 to 263 may be defined by the openings (see FIG. 9). In such an embodiment, the groove 264 may be formed on a bottom surface of at least one of the light shielding patterns 261 to 263.

The direction in which the groove 264 is formed may be the first direction D1. In such an embodiment, the groove 264 may be formed by being depressed in a direction from the bottom surface 260a of the light shielding pattern 260 to the top surface of the light shielding pattern 260. In an embodiment, as shown in FIG. 2, the width of the groove 264 may be constant. However, the shape of the groove 264 is not limited thereto, and the width may become narrower or wider as the groove 264 goes in the first direction D1.

In such an embodiment, the depth t1 of the groove 264 is not limited, and the depth t1 of the groove 264 may be less than or equal to the height h1 of the light shielding pattern 260. As the depth t1 of the groove 264 becomes less, the amount of the material forming the spacer 250 may decrease. Accordingly, the cost of manufacturing the spacer 250 may be reduced, and the time for manufacturing the spacer 250 may be reduced.

In an embodiment, the spacer 250 may be disposed in the groove 264. In such an embodiment, a material forming the spacer 250 may be disposed in the groove 264. The spacer 250 may serve to maintain a gap h4 between the light shielding pattern 260 and the light emitting structure 120 disposed on the bottom surface of the upper substrate 210. In such an embodiment, the spacer 250 may serve to maintain the gap h4 to be constant.

The spacer 250 may protrude from the upper substrate 210 to the lower substrate 110 to maintain the gap h4 and may protrude from the bottom surface 260a of the light shielding pattern 260. A lower end of the spacer 250 may be determined to be lower (or more inwardly) than a lower end of the light shielding pattern 260. The lower end (or inner end) of the spacer 250 may be about 3 micrometers lower than the lower end (or inner end) of the light shielding pattern 260. The difference h4 between the lower end of the spacer 250 and the lower end of the light shielding pattern 260 is not limited thereto, and may be less than or greater than about 3 micrometers. Accordingly, the spacer 250 may separate the lower surface of each of the light shielding patterns 260 and the upper surface of the light emitting structure 120. A height h3 is a height of the spacer 250, and the height h3 may mean a sum of the gap h4 and the depth t1 of the groove 264.

In an embodiment, the spacer 250 may include a substance which is the same as one of the materials 221, 222, and 223 of the first color conversion layer, the materials 231, 232, and 233 of the second color conversion layer, and the materials 241 and 242 of the transmissive layer. In such an embodiment, the spacer 250 may be formed of a material of one selected from the materials 221, 222, and 223 of the first color conversion layer, the materials 231, 232, and 233 of the second color conversion layer, and the materials 241 and 242 of the transmissive layer. In one embodiment, for example, the spacer 250 may include or be formed of the materials 241 and 242 of the transmissive layer 240, which is the lowest cost among the materials 221, 222, and 223 of the first color conversion layer, the materials 231, 232, and 233 of the second color conversion layer and the materials 241 and 242 of the transmissive layer, to reduce the cost of the manufacturing process of the display device 10. In such an embodiment, when manufacturing the spacer 250 using the materials 241 and 242 of the transmissive layer 240, the cost of manufacturing the spacer 250 may be reduced.

Referring again to FIG. 3, in an embodiment, the transmissive layer 240 may include third scattering particles 241 and a third photosensitive polymer 242. In an embodiment, if the spacer 250 is formed of the materials 221, 222, 223 of the first color conversion layer and the materials 231, 232, 233 of the second color conversion layer, the first and second quantum dots 223 and 233 included in each of the first and second color conversion layers 220 and 230 may affect other members of the display device 10 (e.g., the thin film encapsulation layer 122). Therefore, in an embodiment, a spacer may be formed using the materials 241 and 242 of the transmissive layer 240 since the materials 241 and 242 of the transmissive layer 240 do not include the first and second quantum dots 223 and 233.

However, the material of the spacer 250 is not limited thereto, and other materials may be used as long as the other materials may be disposed in the groove 264 and protrude from the bottom surface 260a of the light shielding pattern 260.

In an embodiment, the spacer 250 may be formed simultaneously with the first color conversion layer 220, the second color conversion layer 230, and the transmissive layer 240 to reduce the manufacturing process of the display device 10. In such an embodiment, the spacer 250, the first color conversion layer 220, the second color conversion layer 230, and the transmissive layer 240 may be formed in the inkjet method.

In such an embodiment where the first color conversion layer 220, the second color conversion layer 230, the transmissive layer 240, and the spacer 250 are formed by the inkjet method, a patterning process using the mask may not be added. In such an embodiment, since the mask is not used in the inkjet method, the manufacturing cost of the display device 10 may be reduced.

In such an embodiment, since the first color conversion layer 220, the second color conversion layer 230, the transmissive layer 240, and the spacer 250 may be formed at the same time by the inkjet method, without using any additional process for forming the spacer 250. In such an embodiment, manufacturing cost and time may be reduced, and the process may be simplified. In an embodiment of the invention, as described above, the first color conversion layer 220, the second color conversion layer 230, the transmissive layer 240, and the spacer 250 may be manufactured at the same time by the inkjet process, but the method of manufacturing the first color conversion layer 220, the second color conversion layer 230, the transmissive layer 240, and the spacer 250 is not limited thereto.

Referring back to FIG. 2, the first color filter layer 271 may be disposed between the upper substrate 210 and the first color conversion layer 220, and may selectively transmit the light Lr of the first color emitted from the first color conversion layer 220. The second color filter layer 272 may be disposed between the upper substrate 210 and the second color conversion layer 230 and may selectively transmit the second color light Lg emitted from the second color conversion layer 230. The third color filter layer 273 may be disposed between the upper substrate 210 and the transmissive layer 240, and may selectively transmit the third color light Lb transmitted from the transmissive layer 240.

The first color filter layer 271 may be disposed on (or to overlap) at least the first pixel area PA1, the second color filter layer 272 may be disposed on at least the second pixel area PA2, and the third color filter layer 273 may be disposed on at least the third pixel area PA3.

The third color light Lb may have a wavelength shorter than that of the first color light Lr and the second color light Lg. The third color light Lb may be blue light, the first color light Lr may be red light, and the second color light Lg may be green light.

The filling layer 300 may be disposed between the light emitting structure 120 and the first color conversion layer 220, the second color conversion layer 230 and the transmissive layer 240. The filling layer 300 may be an insulating layer or an air layer including a transparent material. The filling layer 300 may maintain the gap h4. The filling layer 300 may be formed when the upper substrate structure 200 and the lower substrate structure 100 are respectively manufactured, and then the upper substrate structure 200 and the lower substrate structure 100 are combined with each other.

The top surface of the filling layer 300 may contact the light shielding pattern 260, the first color conversion layer 220, the second color conversion layer 230, the transmissive layer 240, and the spacer 250, and the bottom surface of the filling layer 300 may contact the thin film encapsulation layer 122. A portion of the spacer 250 may be disposed through the filling layer 300 and contact the light emitting structure 120. In such an embodiment, the portion of the spacer 250 may contact the upper surface of the thin film encapsulation layer 122 included in the light emitting structure 120.

In embodiments of the invention, as described above, the display device 10 may include the groove 264 defined or formed on a bottom surface of the light shielding pattern 260, and the spacer 250 may be disposed in the groove 264. In such embodiments, since the spacer 250 may be manufactured together with the first color conversion layer 220, the second color conversion layer 230 and the transmissive layer 240, a separate process for manufacturing the spacer 250 may not be added. Accordingly, the manufacturing cost of the display device 10 may be reduced and the manufacturing time may be reduced.

Figure 4:
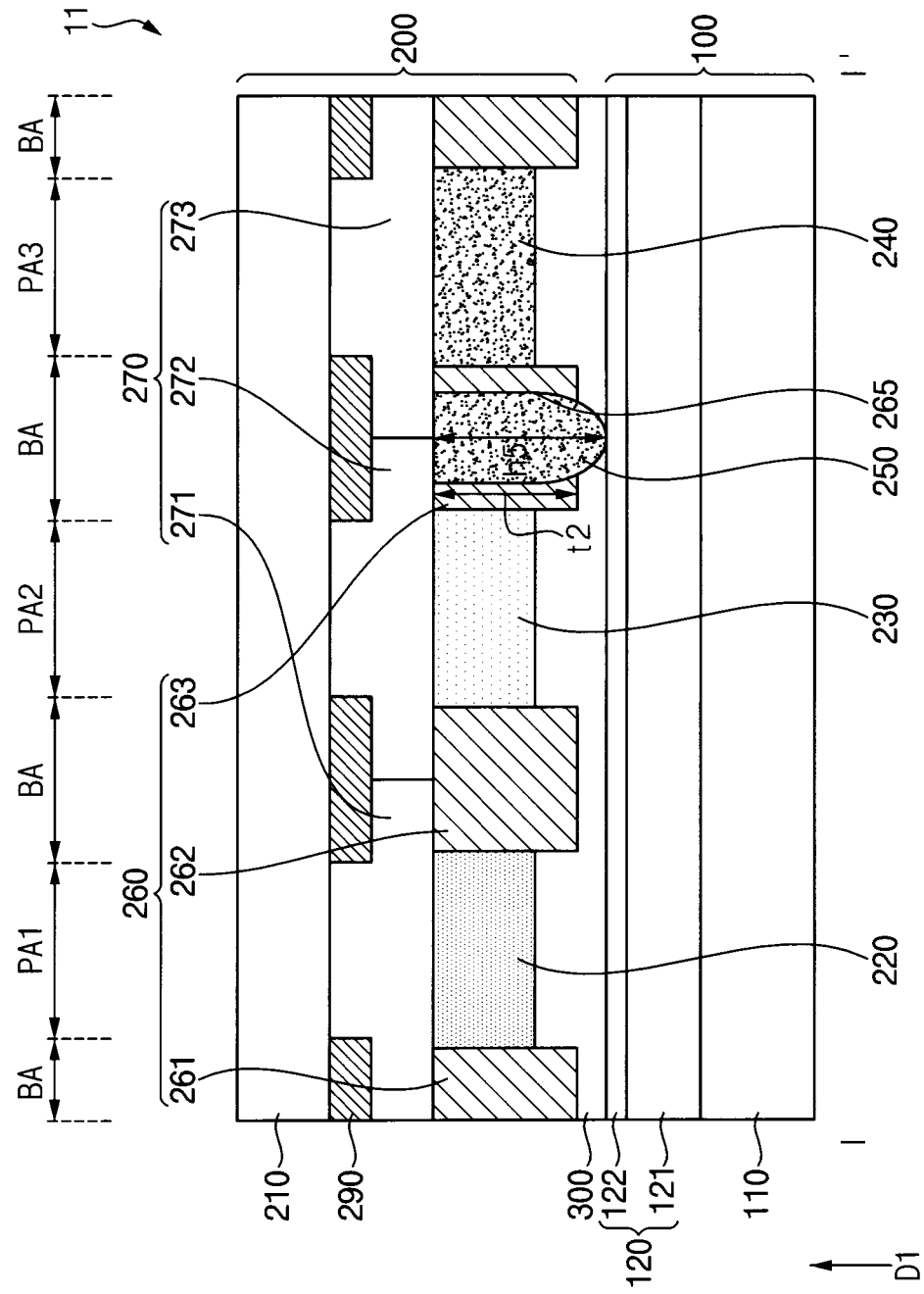
FIG. 4 is a cross-sectional view illustrating a display device according to an alternative embodiment.

FIG. 4 is a cross-sectional view illustrating a display device according to an alternative embodiment.

Referring to FIG. 4, an embodiment of a display device 11 may include a through opening 265 instead of the groove 264 shown in FIG. 2. In such an embodiment, the groove 264 may extend in a direction from the lower substrate 110 to the upper substrate 210 and may be defined as a through opening 265, and the spacer 250 may be disposed in the through opening 265. In such an embodiment, the through opening 265 of FIG. 4 may correspond to the groove 264 of FIG. 2. The groove 264 may extend in a direction toward the upper surface of the light shielding pattern 260 to form a through opening 265. In such an embodiment, the spacer 250 may contact the color filter layer 270. The height h5 of the through opening 265 may be greater than the height h1 of the light shielding pattern 260. In such an embodiment, the shape of the through opening 265 is not limited as described above with reference to the groove 264 of FIG. 2.

An embodiment of the display device 11 including the through opening 265 may have relatively increased adhesion of the spacer 250 compared to an embodiment of the display device 10 including the groove 264. In such an embodiment, since the contact area between the spacer 250 and the light shielding pattern 260 is relatively increased, the spacer 250 may be effectively prevented from being peeled from the light shielding pattern 260.

Figure 5:
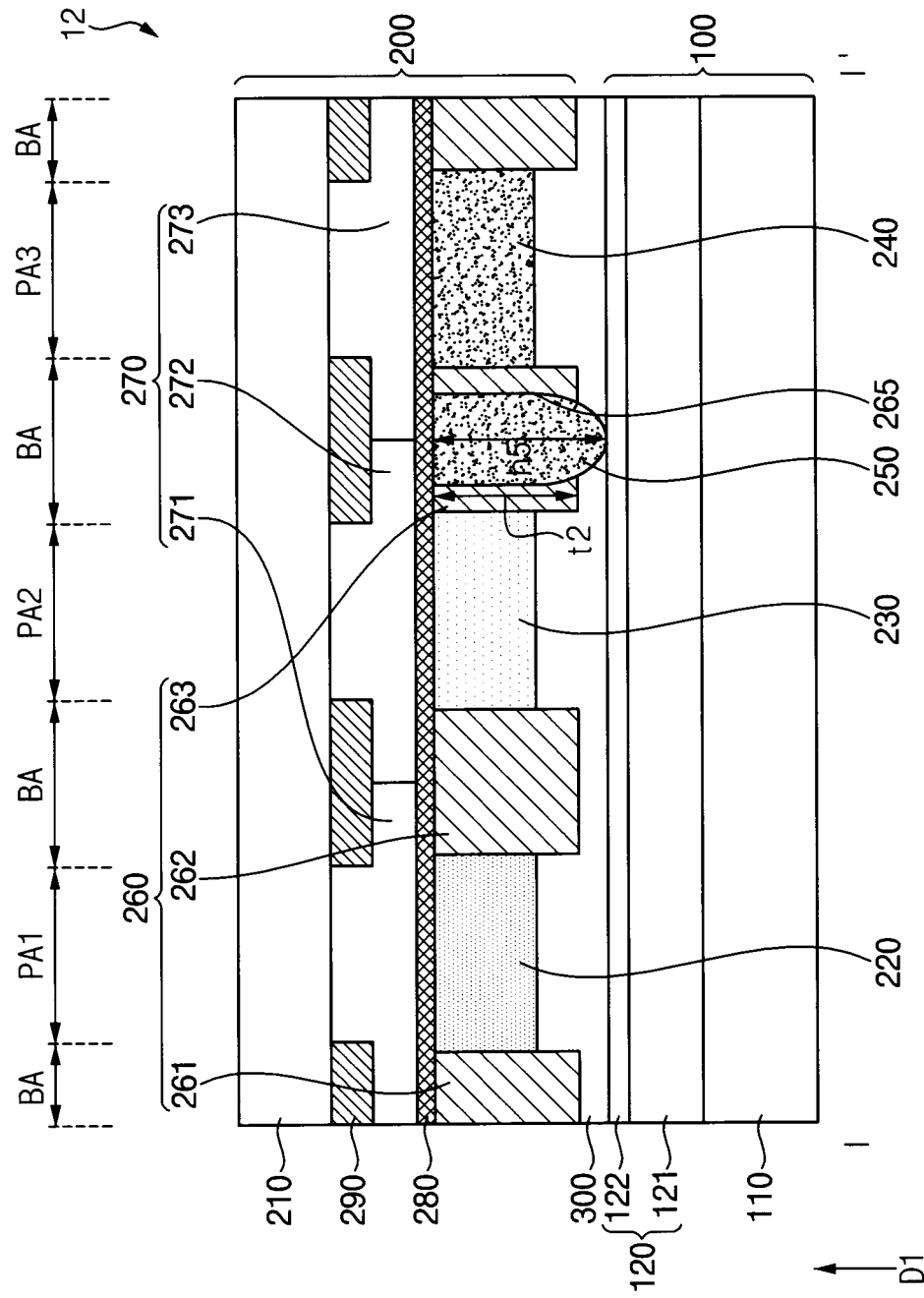
FIG. 5 is a cross-sectional view illustrating a display device according to another alternative embodiment.

FIG. 5 is a cross-sectional view illustrating a display device according to another alternative embodiment.

Referring to FIG. 5, an embodiment of a display device 12 may further include an inorganic protective layer 280, and the inorganic protective layer 280 may be disposed between the color conversion layer 230 and the transmissive layer 240. In such an embodiment, the inorganic protective layer 280 may be disposed between the bottom surface of the color filter layer 270 and the first color conversion layer 220, the second color conversion layer 230, and the transmissive layer 240. The inorganic protective layer 280 may protect the color filter layer 270. In such an embodiment, as described above, the groove 264 may extend in a direction from the lower substrate 110 to the upper substrate 210 to form the through opening 265, and the spacer 250 may be disposed in the through opening 265. In such an embodiment, the spacer 250 is disposed in the through opening 265, and the spacer 250 may contact the inorganic protective layer 280.

In an embodiment where the display device 12 further includes the inorganic protective layer 280, the color filter layer 270 and the light shielding pattern 260, the first color conversion layer 220, the second color conversion layer 230, and the transmissive layer 240 may be prevented from mixing. In such an embodiment, the inorganic protective layer 280 may protect the color filter layer 270, the first color conversion layer 220, the second color conversion layer 230, and the transmissive layer 240 from an impact, such that the inorganic protective layer 280 may prevent a damage of the color filter layer 270, the first color conversion layer 220, the second color conversion layer 230, and the transmissive layer 240.

In an embodiment where the inorganic protective layer 280 contacts the spacer 250, the spacer 250 may contact not only the light shielding pattern 260 but also the inorganic protective layer 280, thereby increasing the adhesion of the spacer 250 relatively. That is, the spacer 250 is effectively prevented from being peeled from the light shielding pattern 260.

Figure 6:
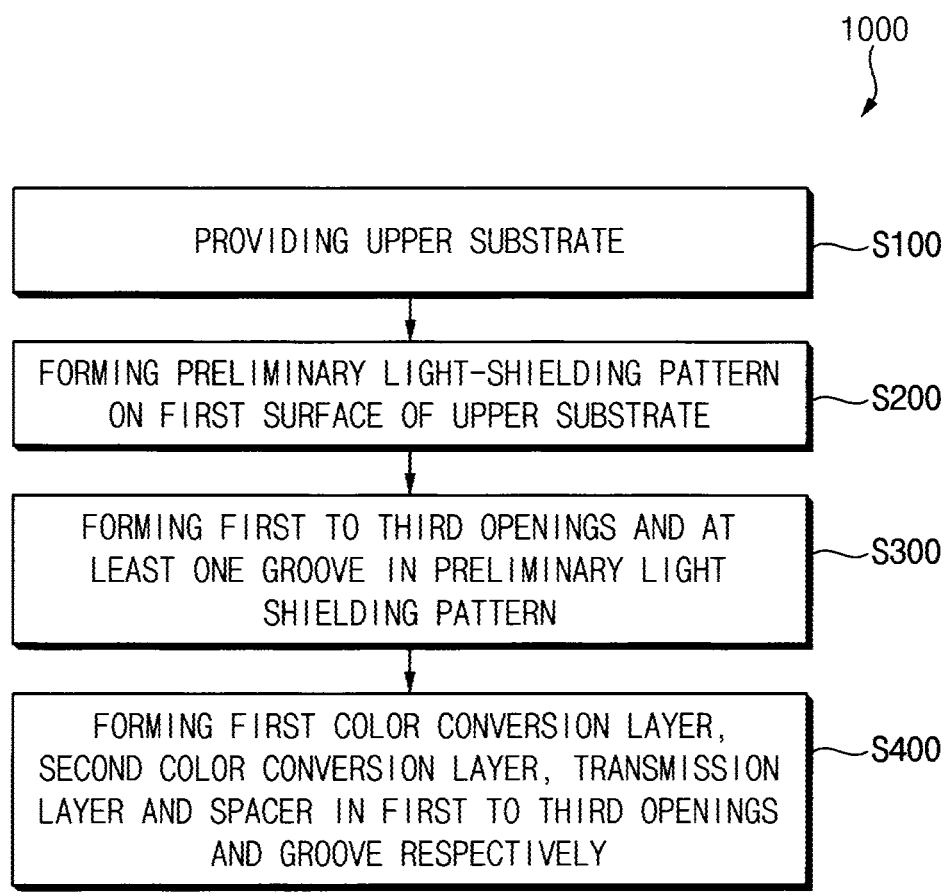
FIG. 6 is a flowchart illustrating a method of manufacturing a display device according to an embodiment.

FIG. 6 is a flowchart illustrating a method of manufacturing a display device according to an embodiment, and FIGS. 7, 8, 9, 10, 11, and 12 are cross-sectional views illustrating a method of manufacturing a display device according to an embodiment.

Figure 7:
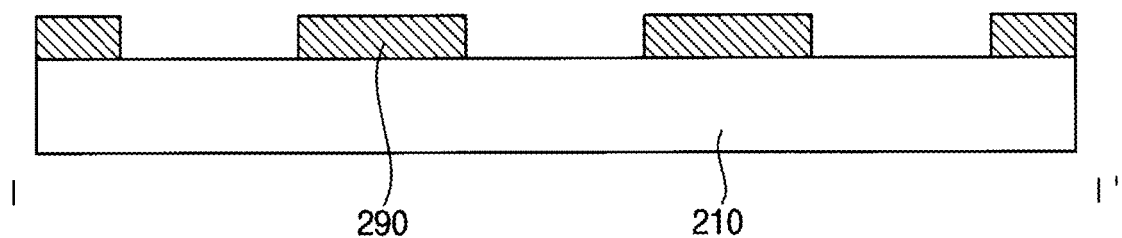
FIGS. 7, 8, 9, 10, 11, and 12 are cross-sectional views illustrating a method of manufacturing a display device according to an embodiment.

FIG. 1, FIG. 6 and FIG. 7, in an embodiment of a method 1000 of manufacturing a display device, an upper substrate 210 may be provided or prepared (S100). The upper substrate 210 may be formed using a material such as glass, metal, or organic material. The upper substrate 210 may include first to third pixel areas PA1, PA2, and PA3 and a light shielding area BA. The light shielding layer 290 may be formed in the light shielding area BA on the upper substrate 210. The light shielding layer 290 may be formed by spraying organic ink, or may be formed by patterning a metal layer provided on the upper substrate 210.

Figure 8:
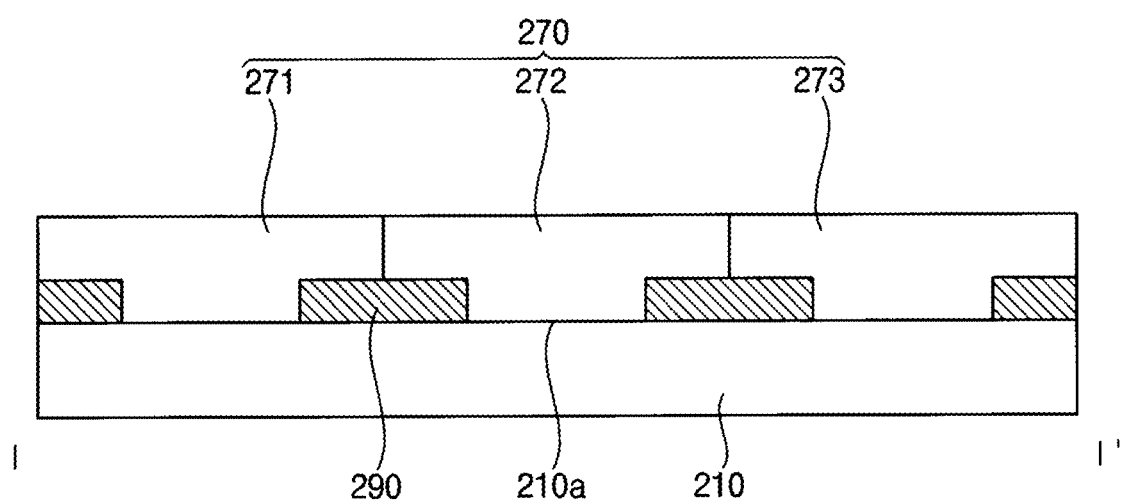

Referring to FIG. 8, a color filter layer 270 may be provided or formed on the upper substrate 210 on which the light shielding layer 290 is formed. In an embodiment, the color filter layer 270 may be disposed in openings on an exposed portion 210a of the upper surface of the upper substrate 210. The color filter layer 270 may be formed by applying a color photoresist on the upper substrate 210 and then selectively patterning the color photoresist. In an embodiment, the first to third color filter layers 271, 272, and 273 may be formed separately, and the order of forming the first to third color filter layers 271, 272 and 273 is not limited.

Figure 9:
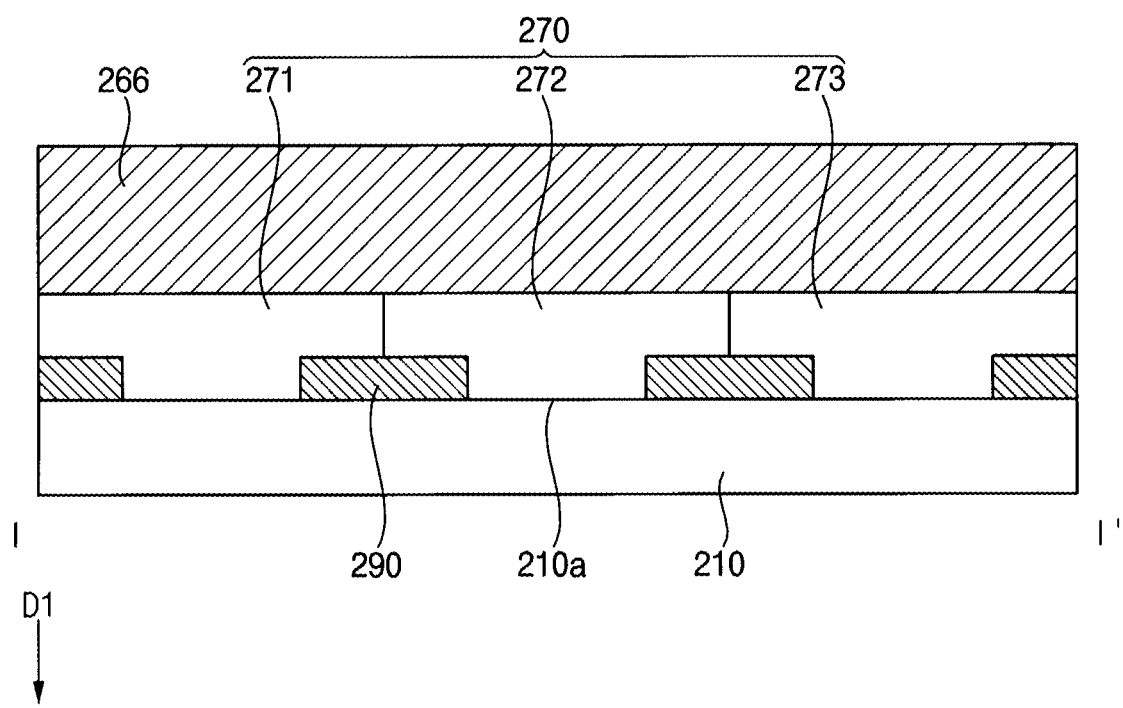

FIG. 6 and FIG. 9, a preliminary light shielding pattern 266 may be provided or formed on the color filter layer 270 (S200). The preliminary light shielding pattern 266 may be applied on the color filter layer 270 and may be formed to overlap the upper substrate 210.

Figure 10:
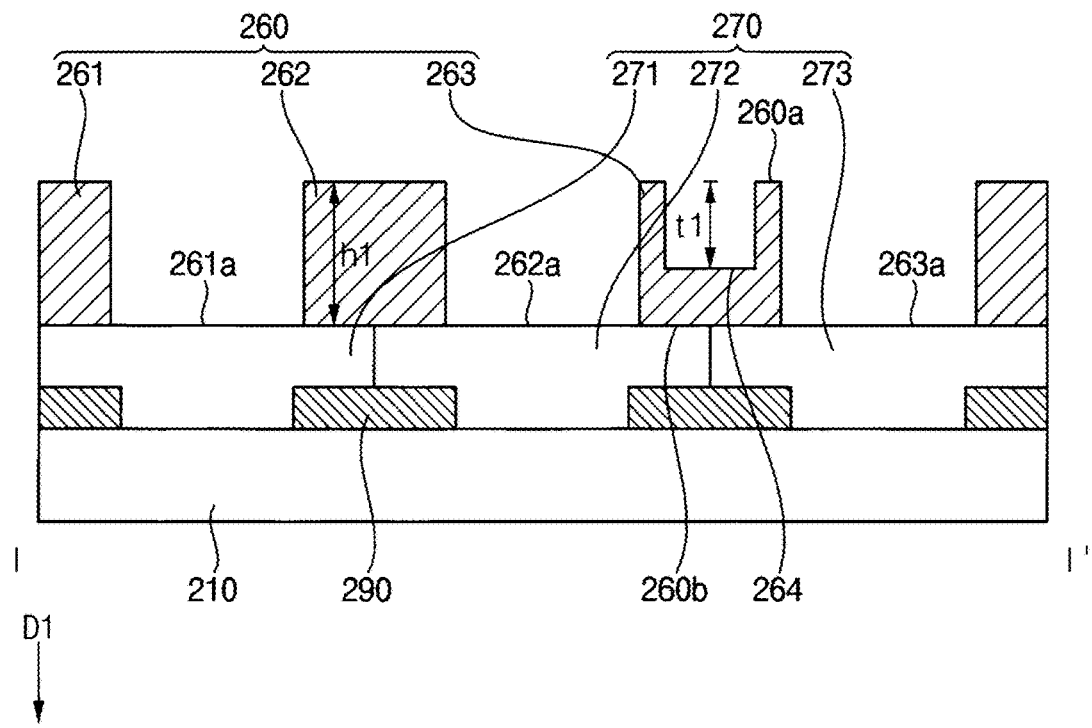

FIG. 6 and FIG. 10, first to third openings 261a, 262a, 263a and at least one groove 264 may be formed on the preliminary light shielding pattern 266 (S300). In an embodiment, the first to third light shielding patterns 261 to 263 may be defined by the first to third openings 261a, 262a, and 263a of the preliminary light shielding pattern 266. In such an embodiment, the first opening 261a may be an opening formed between the first and second light shielding patterns 261 and 262, and the second opening 262a may be an opening formed between the second and third light shielding patterns 262 and 263. The third opening 263a may be an opening formed between the third light shielding pattern 263 and an adjacent light shielding pattern thereof, e.g., a next first light shielding pattern. The first to third openings 261a, 262a, and 263a may be formed by applying the preliminary light-shielding pattern 266 on the upper substrate 210 and then patterning the preliminary light-shielding pattern 266, thereby defining the first to third light-shielding patterns 261 to 263. In such an embodiment, the meaning that the first to third openings 261a, 262a, and 263a are formed may mean that the light shielding pattern 260 is formed.

A groove 264 may be formed on the first surface 260a of the light shielding pattern 260. Here, the groove 264 means that the first surface 260a of at least one selected from the first to third light shielding patterns 261 to 263 is concavely formed. The first surface 260a may become an inner surface when the display device is manufactured. The first surface 260a may be an upper surface as shown in FIG. 10, but may become a lower surface in the manufacturing process of the display device 10. The groove 264 may be formed at the same time when forming the first to third openings 261a, 262a, 263a. The groove 264 may be formed to have a depth t1. In one embodiment, for example, the preliminary light shielding pattern 266 may be applied on the upper substrate 210. A pattern may be formed by patterning the preliminary light shielding pattern 266 using a mask in which a pattern corresponding to the light shielding pattern 260 and the groove 264 is formed. In such an embodiment, a halftone mask or the like may be used, such that the size and depth of the groove 264 may be adjusted to a desired degree.

The direction in which the groove 264 is formed may be the first direction D1. In one embodiment, for example, the first direction D1 may be a direction from the lower substrate 110 to the upper substrate 210. That is, the groove 264 may be formed by being depressed in a direction from the first surface 260a to the second surface 260b of the light shielding pattern 260. In an embodiment, as shown in FIG. 10, the groove 264 may have a constant width. However, the shape of the groove 264 is not limited thereto, and alternatively, the width may increase or decrease as the groove 264 goes in the first direction D1.

In an embodiment, the depth t1 of the groove 264 is not limited, and the depth t1 of the groove 264 may be less than or equal to the height h1 of each of the light shielding patterns 260. As the depth t1 of the groove 264 becomes shorter, the amount of the material forming the spacer 250 may decrease. Accordingly, a cost for manufacturing the display device 10 may be reduced, and a time for manufacturing the spacer 250 may be reduced.

Figure 11:
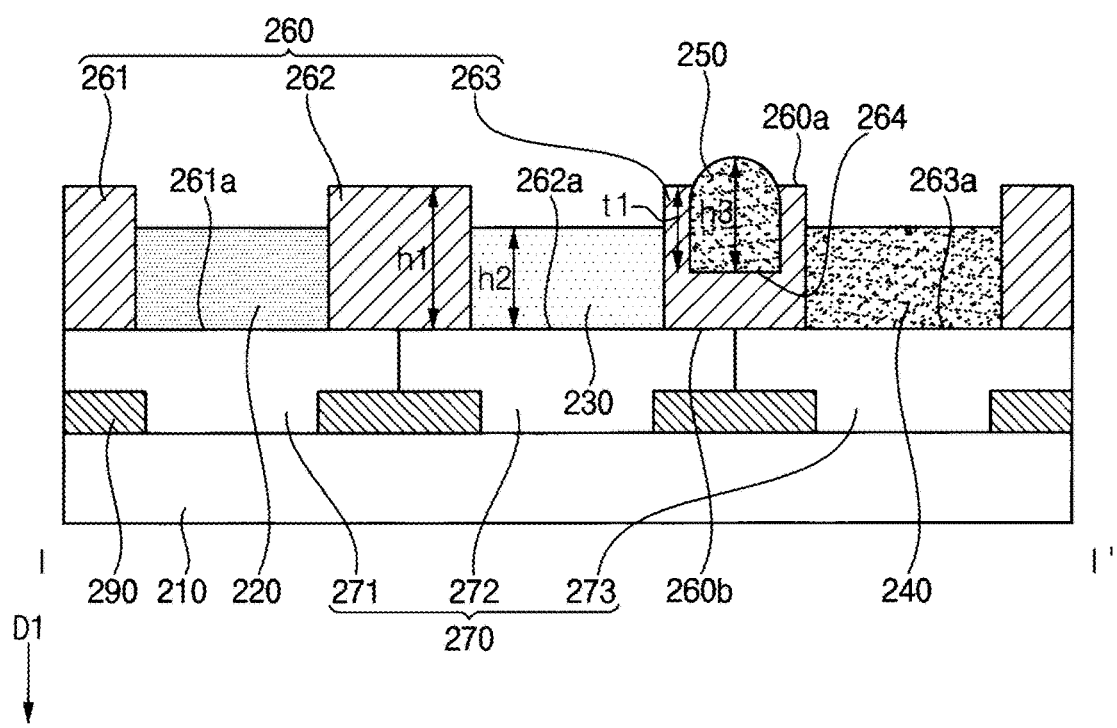

Referring to FIG. 6 and FIG. 11, the first color conversion layer 220, the second color conversion layer 230, and the transmissive layer 240 may be respectively provided or formed in the first to third openings 261a, 262a, and 263a (S400). The spacer 250 may be formed in the groove 264 (S400). The first color conversion layer 220, the second color conversion layer 230, the transmissive layer 240, and the spacer 250 may be formed on the upper substrate 210 on which the color filter layer 270 is formed. The first color conversion layer 220, the second color conversion layer 230, and the transmissive layer 240 may be formed in the first pixel area PA1, the second pixel area PA2, and the third pixel area PA3, respectively (refer to FIG. 1).

The first color conversion layer 220, the second color conversion layer 230, the transmissive layer 240, and the spacer 250 may be formed at the same time. The height h1 of the light shielding pattern 260 may be designed or determined so that the first color conversion layer 220, the second color conversion layer 230 and the transmissive layer 240 do not overflow into adjacent pixel areas when the first color conversion layer 220, the second color conversion layer 230, and the transmissive layer 240 are formed. Therefore, the height h2 of each of the first color conversion layer 220, the second color conversion layer 230, and the transmissive layer 240 may be substantially the same as each other, and may be smaller than the height h1 of the light shielding pattern 260. The height h2 of each of the first color conversion layer 220, the second color conversion layer 230, and the transmissive layer 240 may be about 10 micrometers, and the height h1 of each of the light shielding patterns 260 may be about 11.5 micrometers.

Each of the first color conversion layer 220, the second color conversion layer 230, and the transmissive layer 240 may be formed in the first to third openings 261a, 262a and 263a in an inkjet method. The spacer 250 may be formed in the groove 264 in the inkjet method.

In such an embodiment, since the first color conversion layer 220, the second color conversion layer 230, the transmissive layer 240, and the spacer 250 are formed by an inkjet method, a patterning process using a mask may not be additionally performed. In addition, in the inkjet method, since material is not wasted and a mask is not used, manufacturing cost of the display device 10 may be reduced.

In such an embodiment, since the first color conversion layer 220, the second color conversion layer 230, the transmissive layer 240, and the spacer 250 may be formed at the same time, an additional process may not be performed. Accordingly, manufacturing cost and time may be reduced, and the process may be simplified. In an embodiment, as described above, the first color conversion layer 220, the second color conversion layer 230, the transmissive layer 240, and the spacer 250 manufactured by the inkjet process have been described, but are not limited thereto.

The spacer 250 may protrude from the upper substrate 210 to the lower substrate 110 to maintain the gap h4 and may protrude from the first surface 260a of the light shielding pattern 260. An upper end of the spacer 250 may be determined to be higher (or more inward) than an upper end of the light shielding pattern 260. The upper end (or inner end) of the spacer 250 may be about 3 micrometers higher (or more inward) than the upper end (or inner end) of the light shielding pattern 260. The difference h4 between the upper end of the spacer 250 and the upper end of the light shielding pattern 260 is not limited thereto, and may be less than or greater than about 3 micrometers. Accordingly, the spacer 250 may separate each the first surface 260a of the light shielding pattern 260 and the light emitting structure 120.

The spacer 250 may include a material of one selected from the materials 221, 222, and 223 of the first color conversion layer 220, the materials 231, 232, and 233 of the second color conversion layer 230, and the materials 241 and 242 of the transmissive layer 240. In such an embodiment, the material of the spacer 250 may be the same as one selected from the materials 221, 222, and 223 of the first color conversion layer 220, the materials 231, 232, and 233 of the second color conversion layer 230, and the materials 241 and 242 of the transmissive layer 240. In an embodiment, the spacer 250 may include or be formed of the materials 241 and 242 of the transmissive layer 240, which have the lowest cost among the materials 221, 222, and 223 of the first color conversion layer 220, the materials 231, 232, and 233 of the second color conversion layer 230 and the materials 241 and 242 of the transmissive layer 240, to reduce the cost of the manufacturing process of the display device 10.

Referring back to FIG. 3, the transmissive layer 240 may include the third scattering particles 241 and the third photosensitive polymer 242. If the spacer 250 is formed of the materials 221, 222, and 223 of the first color conversion layer and the materials 231, 232, and 233 of the second color conversion layer, the first and second quantum dots 223 and 233 included in each of the first and second color conversion layers 220 and 230 may affect other members of the display device 10 (e.g., the thin film encapsulation layer 122). Therefore, in an embodiment, a spacer may be formed using the materials 241 and 242 of the transmissive layer 240 since the materials 241 and 242 of the transmissive layer 240 do not include the first and second quantum dots 223 and 233.

However, the material of the spacer 250 is not limited thereto, and other materials may be used as long as the spacer 250 is formed in the groove 264 and protrudes from the first surface 260a of the light shielding pattern 260.

Figure 12:
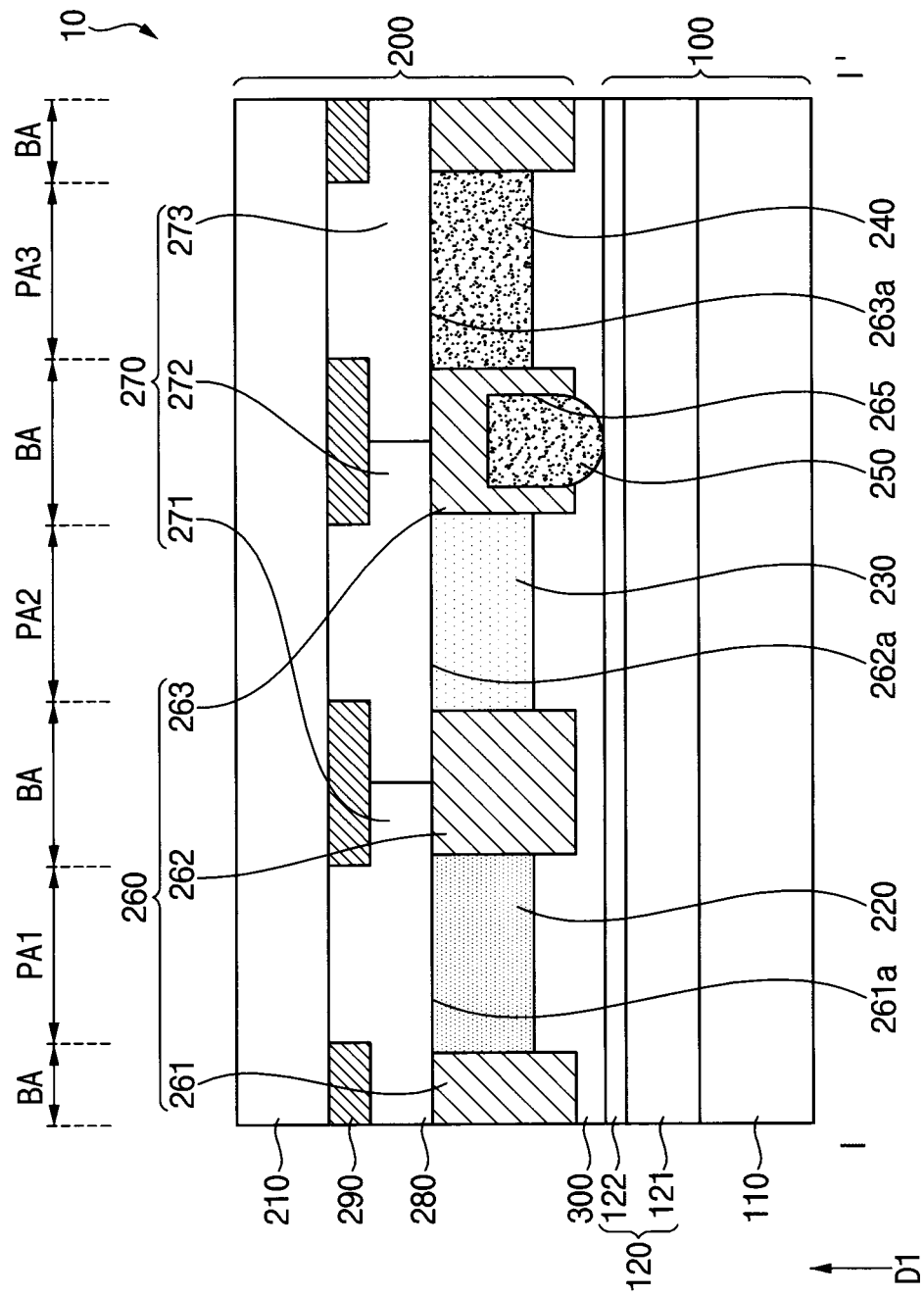

Referring to FIG. 6 and FIG. 12, the light emitting structure 120 may be provided or formed on the lower substrate 110. The upper substrate structure 200 may include an upper substrate 130, a first color conversion layer 140, a second color conversion layer 150, a first light shielding pattern 261, a second light shielding pattern 262, a third light shielding pattern 263 and the spacer 250. The lower substrate structure 100 may include a lower substrate 110 and a light emitting structure 120. The upper substrate structure 200 and the lower substrate structure 100 may be combined with each other after each being manufactured.

In a process of combining the upper substrate structure 200 with the lower substrate structure 100, the filling layer 300 may be provided or formed between the upper substrate structure 200 and the lower substrate structure 100. The filling layer 300 may be formed to maintain the gap h4 to be constant. The filling layer 300 may be formed when the upper substrate structure 200 and the lower substrate structure 100 are respectively manufactured, and then the upper substrate structure 200 and the lower substrate structure 100 are combined with each other.

The upper surface of the filling layer 300 may contact the light shielding pattern 260, the first color conversion layer 220, the second color conversion layer 230, the transmissive layer 240, and the spacer 250, and the bottom surface of the filling layer 300 may contact the thin film encapsulation layer 122. A portion of the spacer 250 of the upper substrate structure 200 may be disposed through the filling layer 300 and contact the light emitting structure 120. In an embodiment, the spacer 250 may contact the upper surface of the thin film encapsulation layer 122 included in the light emitting structure 120.

In an embodiment, where the part of the spacer 250 is disposed through the filling layer 300 and directly contacts the light emitting structure 120, the display device 10 may be stabilized compared to a case where only the filling layer 300 is formed between the upper substrate structure 200 and the lower substrate structure 100. Accordingly, in such an embodiment the flow of the display device 10 may be prevented. In such an embodiment, since the spacer 250 performs a fixing role, it may be easy to maintain the gap h4 between the light shielding pattern 260 and the light emitting structure 120.

In an embodiment of the method of manufacturing the display device 10, a process for manufacturing the spacer 250 may not be separately added. An embodiment of the display device 10 manufactured by the above method of manufacturing the display device 10 may include the groove 264 defined or formed on the bottom surface of the light shielding pattern 260, and the spacer 250 may be disposed in the groove 264. In such an embodiment, since the spacer 250 may be manufactured together with the first color conversion layer 220, the second color conversion layer 230 and the transmissive layer 240, a separate process for manufacturing the spacer 250 may not be added. Therefore, when manufacturing the spacer 250, a mask process may not be used. Accordingly, a manufacturing cost of the display device 10 may be reduced, a manufacturing time may be reduced, and a manufacturing process may be simplified.

Embodiments of the display device described herein may be applied to a display device included in a computer, a notebook computer, a mobile phone, a smartphone, a smart pad, a portable media player ("PMP"), a personal digital assistant ("PDA"), an MP3 player, or the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a lower substrate including first and second pixel areas and a light shielding area surrounding the first and second pixel areas;
   a light emitting structure disposed on the lower substrate;
   an upper substrate disposed on the light emitting structure;
   a first color conversion layer disposed in the first pixel area on a bottom surface of the upper substrate;
   a second color conversion layer disposed in the second pixel area on the bottom surface of the upper substrate;
   first to third light shielding patterns disposed in the light shielding area on the bottom surface of the upper substrate;
   a groove defined on a bottom surface of at least one selected from the first to third light shielding patterns; and
   a spacer disposed in the groove, wherein a height of the spacer is greater than a depth of the groove.

2. The display device of claim 1, wherein a material of the spacer is the same as one selected from a material of the first color conversion layer and a material of the second color conversion layer.

3. The display device of claim 1, wherein the spacer protrudes from the bottom surface of the at least one selected from the first to third light shielding patterns in a direction from the upper substrate to the lower substrate.

4. The display device of claim 1, further comprising:
   a filling layer disposed between the light emitting structure and the first and second color conversion layers.

5. The display device of claim 4, wherein a part of the spacer is disposed in the filling layer and contacts the light emitting structure.

6. The display device of claim 1, wherein the spacer separates a bottom surface of each of the first to third light shielding patterns from an upper surface of the light emitting structure.

7. The display device of claim 1, wherein
the lower substrate further includes a third pixel area spaced apart from the first and second pixel areas, and
the display device further comprises a transmissive layer disposed in the third pixel area on a bottom surface of the upper substrate.

8. The display device of claim 7, wherein the spacer includes a same material as one selected form a material of the first color conversion layer, a material of the second color conversion layer, and a material of the transmissive layer.

9. The display device of claim 7, wherein
the first light shielding pattern is disposed on a first side surface of the first color conversion layer,
the second light shielding pattern is disposed between a second side surface of the first color conversion layer and a first side surface of the second color conversion layer, and
the third light shielding pattern is disposed between a second side surface of the second color conversion layer and a first side surface of the transmissive layer.

10. The display device of claim 7, wherein
the first color conversion layer includes first quantum dots which are excited by a light generated from the light emitting structure to emit a first color light,
the second color conversion layer includes second quantum dots which are excited by the light generated from the light emitting structure to emit a second color light, and
the transmissive layer transmits the light generated from the light emitting structure to emit a third color light.

11. The display device of claim 10, wherein the third color light has a wavelength shorter than each of the first color light and the second color light.

12. The display device of claim 10, wherein
the third color light is blue light,
the first color light is red light, and
the second color light is green light.

13. The display device of claim 7, further comprising
a first color filter layer disposed between the upper substrate and the first color conversion layer, wherein the first color filter layer selectively transmits a first color light emitted from the first color conversion layer;
a second color filter layer disposed between the upper substrate and the second color conversion layer, wherein the second color filter layer selectively transmits a second color light emitted from the second color conversion layer; and
a third color filter layer disposed between the upper substrate and the transmissive layer, wherein the third color filter layer selectively transmits a third color light transmitted from the transmissive layer.

14. The display device of claim 1, wherein
the groove extends in a direction from the lower substrate to the upper substrate such that the groove defines a through opening, and
the spacer is disposed in the through opening.

15. The display device of claim 14, further comprising:
an inorganic protective layer disposed between the upper substrate and the first and second color conversion layers.

16. The display device of claim 15, wherein the spacer contacts the inorganic protective layer.

17. A method of manufacturing a display device, the method comprising:
preparing an upper substrate;
providing a preliminary light shielding pattern on a first surface of the upper substrate;
forming first to third openings and a groove in the preliminary light shielding pattern;
providing a first color conversion layer, a second color conversion layer, and a transmissive layer in the first to third openings, respectively; and
providing a spacer in the groove, wherein a height of the spacer is greater than a depth of the groove.

18. The method of claim 17, wherein
first to third light shielding patterns are defined by the first to third openings of the preliminary light shielding pattern, and
the groove is formed in a surface of at least one selected from the first to third light shielding patterns.

19. The method of claim 17, wherein the spacer includes a same material as one selected from a material of the first color conversion layer, a material of the second color conversion layer and a material of the transmissive layer.

20. The method of claim 17, wherein the first to third openings and the groove are simultaneously formed using a halftone mask.

* * * * *